United States Patent
Lee et al.

(10) Patent No.: US 8,786,367 B2
(45) Date of Patent: Jul. 22, 2014

(54) VOLTAGE CONTROLLING CIRCUIT

(75) Inventors: Yung-Ming Lee, New Taipei (TW);
Tzu-Fei Han, Taichung (TW)

(73) Assignee: Princeton Technology Corporation,
Xindian Dist., New Taipei (TW)

( * ) Notice: Subject to any disclaimer, the term of this patent is extended or adjusted under 35 U.S.C. 154(b) by 37 days.

(21) Appl. No.: 13/523,851

(22) Filed: Jun. 14, 2012

(65) Prior Publication Data

US 2012/0326791 A1    Dec. 27, 2012

(30) Foreign Application Priority Data

Jun. 24, 2011    (TW) .............................. 100122257 A

(51) Int. Cl.
*H03G 3/10* (2006.01)
*H03F 1/26* (2006.01)
*H03G 11/00* (2006.01)

(52) U.S. Cl.
CPC .............. *H03F 1/26* (2013.01); *H03G 11/002* (2013.01); *H03F 2200/411* (2013.01); *H03F 2200/441* (2013.01); *H03F 2200/03* (2013.01)
USPC .......................................... 330/278; 330/254

(58) Field of Classification Search
USPC .................... 330/278, 254, 135, 140
See application file for complete search history.

(56) References Cited

U.S. PATENT DOCUMENTS

| | | | |
|---|---|---|---|
| 4,953,008 A * | 8/1990 | Kaye .............................. | 348/577 |
| 5,341,173 A * | 8/1994 | Hyeon ........................ | 348/525 |
| 6,369,527 B1 * | 4/2002 | Morrish ....................... | 315/383 |
| 7,189,953 B2 * | 3/2007 | Machida .................... | 250/208.1 |
| 7,671,675 B2 * | 3/2010 | Miyashita et al. ............ | 330/251 |

FOREIGN PATENT DOCUMENTS

| JP | S62117404 A | 5/1987 |
|---|---|---|
| JP | S62142438 A | 6/1987 |
| JP | H01311711 A | 12/1989 |
| JP | H04207424 A | 7/1992 |
| JP | H07135579 A | 5/1995 |
| JP | H11112345 A | 4/1999 |
| JP | 2004236140 A | 8/2004 |
| JP | 2005323176 A | 11/2005 |
| JP | 2007189434 A | 7/2007 |

\* cited by examiner

*Primary Examiner* — Henry Choe
(74) *Attorney, Agent, or Firm* — Winston Hsu; Scott Margo

(57) ABSTRACT

A voltage clamping module is disposed at an output terminal of a gain amplifying module, so that a voltage level of an amplifying signal outputted by the gain amplifying module can be clamped within a predetermined range. The voltage clamping module includes an upper bound voltage clamping module, which is utilized for limiting the voltage level of the amplifying signal to be lower than an upper bound voltage level, and a lower bound voltage clamping module, which is utilized for limiting the voltage level of the amplifying signal to be higher than a lower bound voltage level.

12 Claims, 15 Drawing Sheets

US 8,786,367 B2

VOLTAGE CONTROLLING CIRCUIT

BACKGROUND OF THE INVENTION

1. Field of the Invention

The present invention discloses a voltage controlling circuit, and more particularly, a voltage controlling circuit for clamping a voltage level of an amplifying signal within a predetermined range so as to restrain peaks.

2. Description of the Prior Art

Please refer to FIG. 1, which is a block diagram of a conventional analog circuit 100. The analog circuit 100 includes a gain amplifying module 110 and a gain controlling module 120. The gain amplifying module 110 is configured to amplify a gain of an input signal, such as an analog signal, so as to generate an amplifying signal. The gain controlling module 120 is configured to control a gain of the amplifying signal according to an external selection signal so as to generate an output signal, for example, generating the output signal by increasing or decreasing the gain of the amplifying signal by different multiples. The analog circuit 100 shown in FIG. 1 amplifies the input signal previously having an extremely-low voltage level with the aid of the gain amplifying module 110 so that the input signal is easier to process. The purpose of the gain controlling module 120 is to re-adjust the gain of the input signal according to different requirements indicated by the selection signal so as to generate the output signal meeting the selected requirement. However, in the design of the analog circuit 100, because of the over-high or over-low voltage level of the amplifying signal generated by the gain amplifying circuit 110, the voltage level of the output signal generated by the gain controlling circuit 120 is also over-high or over-low so that unexpected peaks occur, and precision of the output signal is reduced as a result.

Please refer to FIG. 2, which illustrates the analog circuit 100 shown in FIG. 1 in detail when being utilized for implementing an audio circuit. As shown in FIG. 2, the input signal may be an audio signal. The gain amplifying module 110 includes a first operational amplifier 112 and a variable resistor 114. The gain controlling module 120 includes a capacitor C1, a variable resistor 124, and a second operational amplifier 122. The first operational amplifier 112 and the variable resistor 114 are utilized for amplifying an audio gain of the input signal and for controlling the audio gain within a predetermined range so as to generate the amplifying signal. A high-pass filter is formed by the capacitor C1 and the variable resistor 124 so as to control the gain of the amplifying signal, and the output signal is generated by amplifying the controlled gain of the amplifying signal with the aid of the second operational amplifier 122. The output signal is then transmitted to a rear speaker for audio signal transmission, where resistance of the variable resistor 124 is controlled according to the selection signal. The variable resistor 124 may be combined with a plurality of switches, such as a plurality of transistors, so as to control the gain of the amplifying signal corresponding to different switch states of the plurality of switches determined by the selection signal.

Please refer to FIG. 3, which illustrates an implementation of the variable resistor 124 shown in FIG. 2. As shown in FIG. 3, the variable resistor 124 includes an N-type metal-oxide semiconductor field effect transistor (MOSFET) 124N and a P-type MOSFET 124P connected in parallel. Because of properties of both the N-type MOSFET 124N and the P-type MOSFET 124P, a parasitic bipolar junction transistor (BJT) 126N is formed on the N-type MOSFET 124N, and a parasitic BJT 126P is formed on the P-type MOSFET 124P. When a voltage level at a node LV1, which is located between the capacitor C1 and the variable resistor 124 shown in FIG. 2, is over-high due to the operational amplifier 112 charging the capacitor C1 so that the parasitic BJT 126P is switched on, a voltage level at a node LV2 is also over-high so that high-voltage peaks occur on the output signal Vout. Similarly, when the voltage level at the node LV1 is over-low since the voltage at the node LV1 is over-discharged, the voltage level at the node LV2 is also over-low so that low-voltage peaks occur on the output signal Vout as a result. Please refer to FIG. 4, which illustrates voltage levels at certain nodes of the analog circuit 100 shown in FIG. 2. As shown in FIG. 4, the voltage level at the node LG0 indicating the voltage level of the amplifying signal is in the form of a square wave. When the voltage level at the node LG0 is over-high, an obvious upward peak occurs at the node LV1 and at a front edge of the waveform of the output signal Vout. On the contrary, when the voltage level at the node LG0 is over-low, an obvious downward peak also occurs at the node LV1 and a rear edge of the waveform of the output voltage Vout.

The peaks occurring at the output signal Vout will significantly affect the precision of processing the output signal Vout and introduce noise. When the input signal is an audio signal, the peaks occurring at the output signal Vout will introduce significant noise when the speaker releases audio so that quality of the released audio is defective.

SUMMARY OF THE INVENTION

For neutralizing the noises and peaks in the output signal mentioned in the prior art, the claimed invention discloses a voltage controlling circuit for clamping the voltage level of the amplifying signal within a predetermined range, so as to prevent the noises and the peaks in the output signal introduced by an over-high or over-low voltage level of the amplifying signal.

The disclosed voltage controlling circuit comprises a gain amplifying module, a voltage clamping module, and a gain controlling module. The gain amplifying module is utilized for generating an amplifying signal according to an input signal. The voltage clamping module is coupled to the gain amplifying module for clamping a voltage level of the amplifying signal within a predetermined range so as to generate a voltage clamping signal. The gain controlling module is coupled to the voltage clamping module for generating an output signal according to a selection signal and the voltage clamping signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
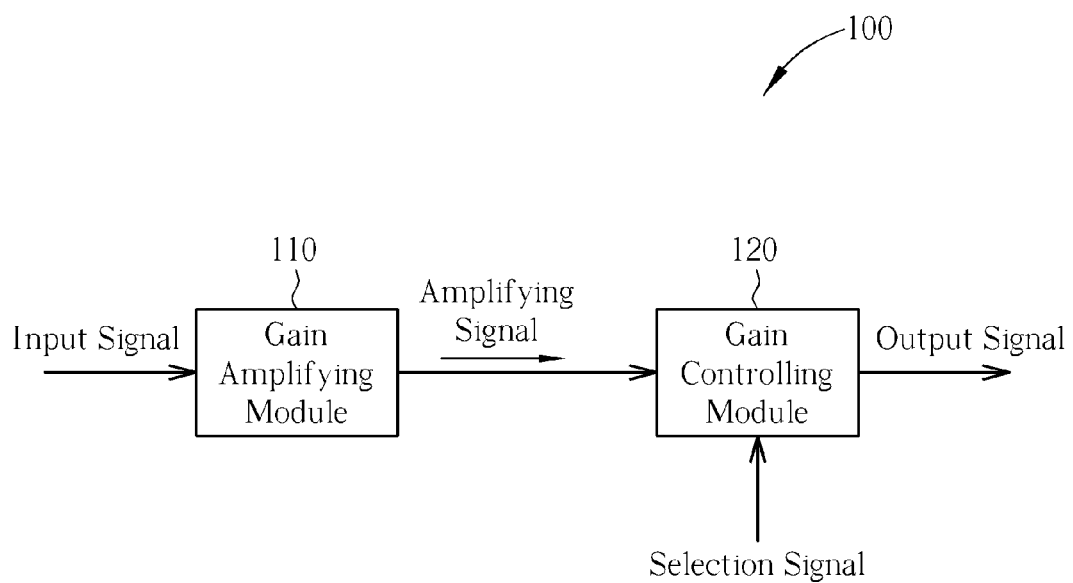
FIG. 1 illustrates a conventional analog circuit.
Figure 2:
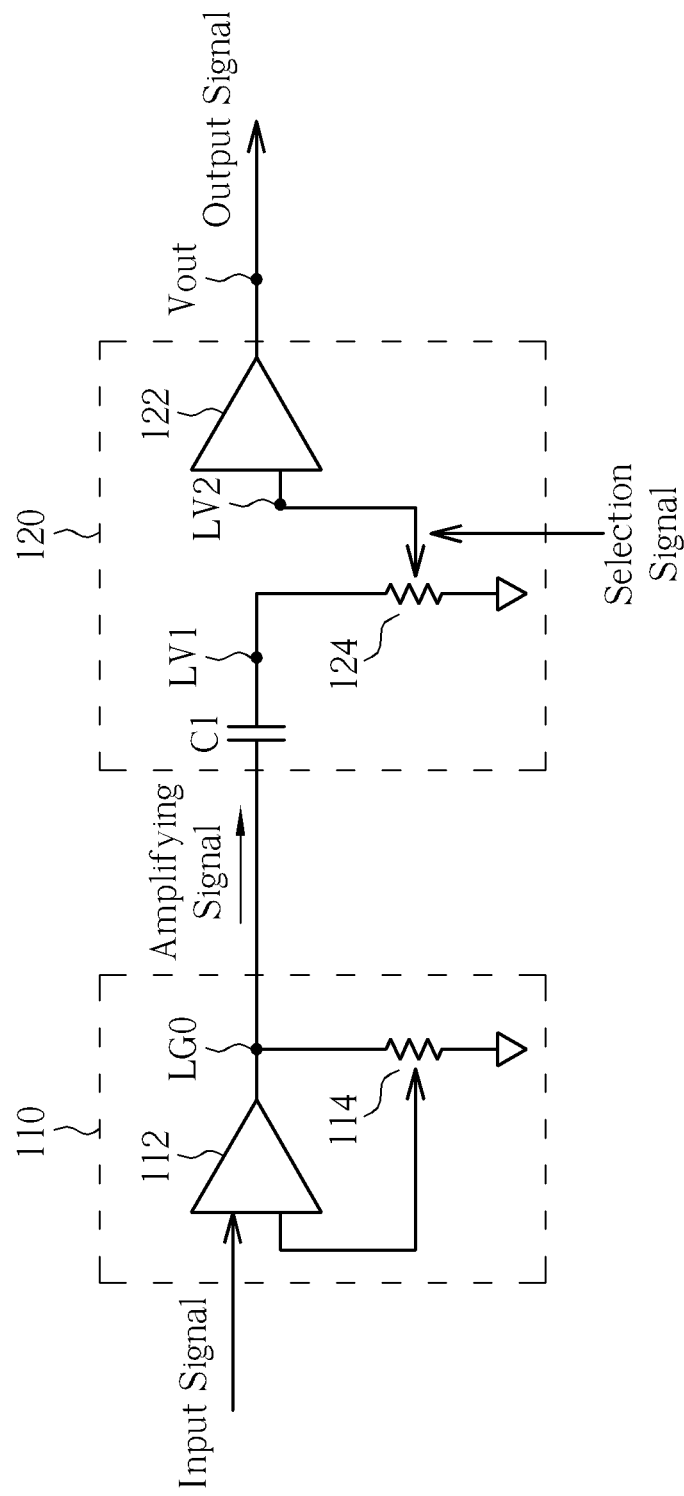
FIG. 2 illustrates an audio circuit implemented by the analog circuit shown in FIG. 1 in detail.
Figure 3:
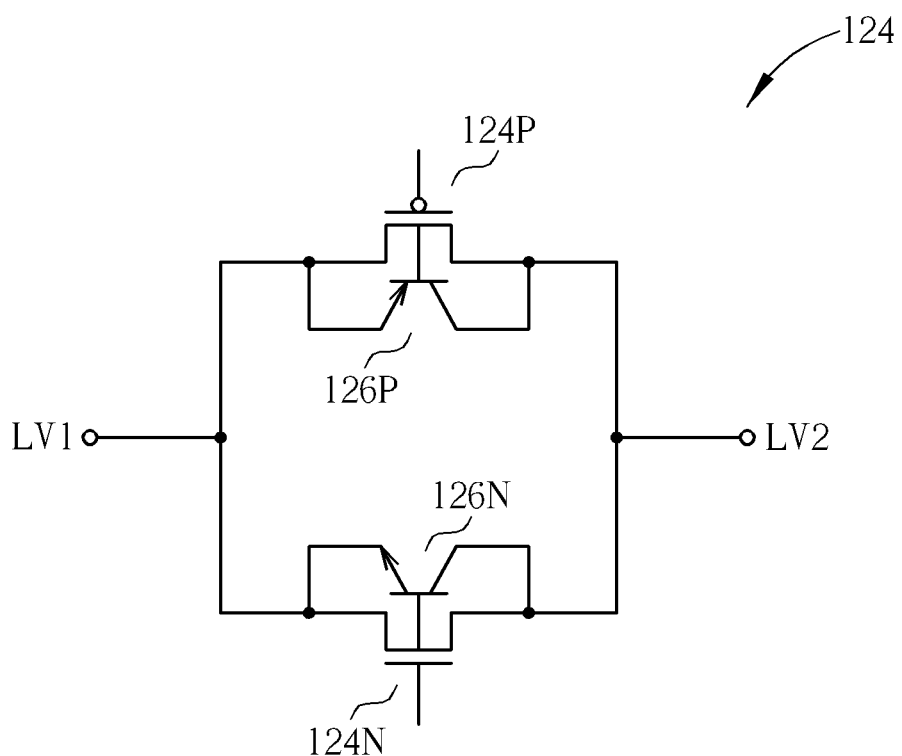
FIG. 3 illustrates an implementation of a variable resistor shown in FIG. 2.
Figure 4:
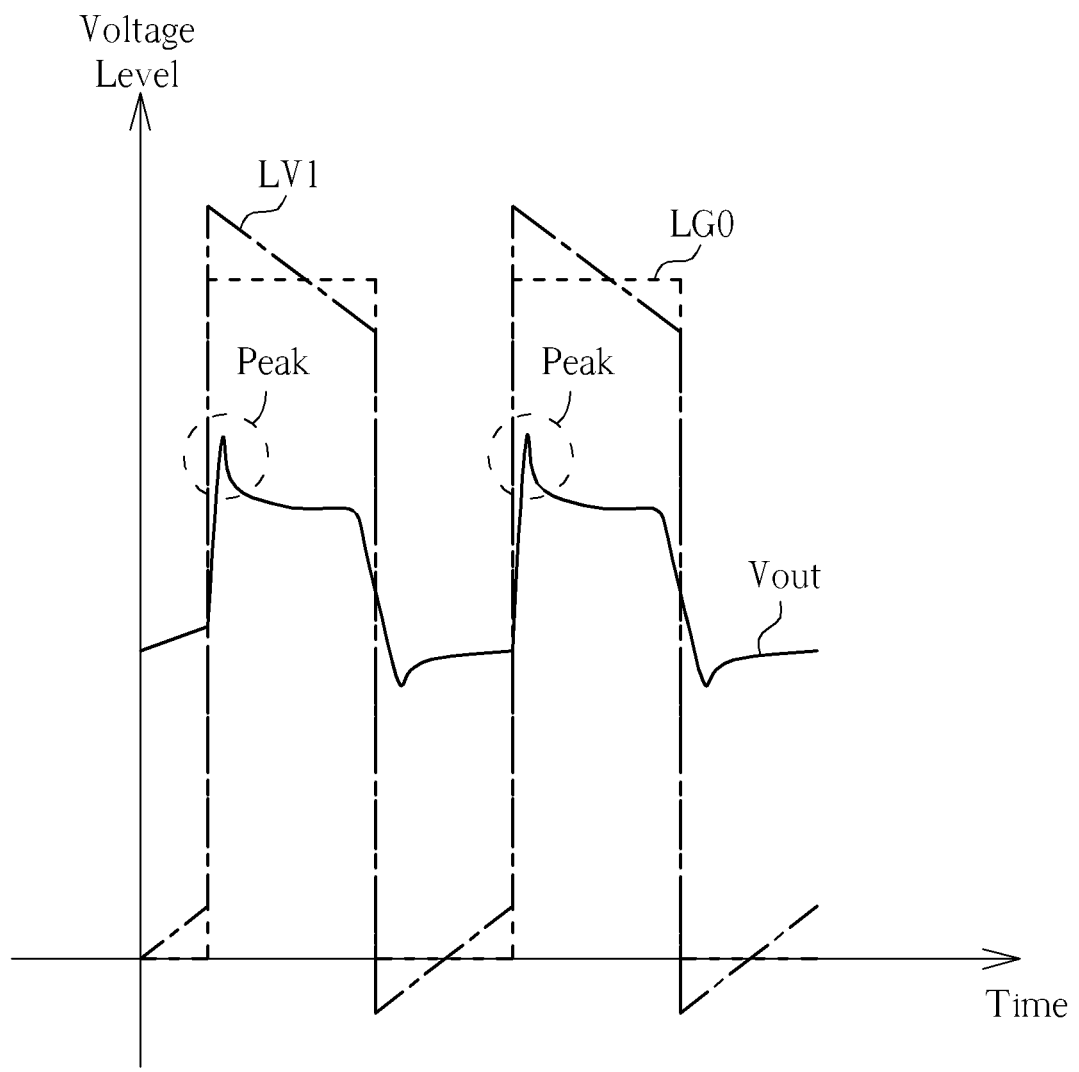
FIG. 4 illustrates voltage levels of certain nodes of the analog circuit shown in FIG. 2.
Figure 5:
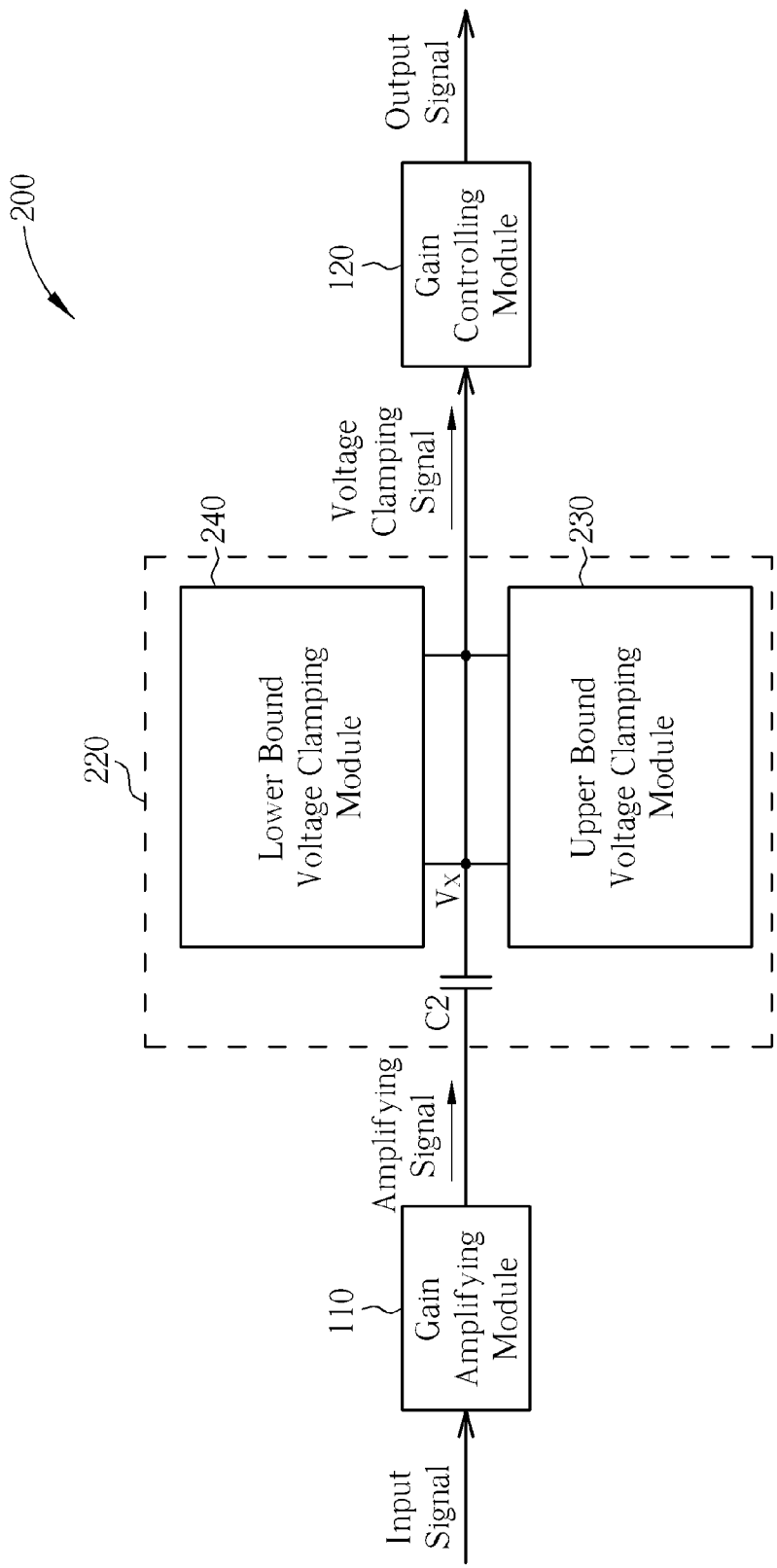
FIG. 5 illustrates a block diagram of a voltage controlling circuit according to one embodiment of the present invention.

Please refer to FIG. 5, which is a block diagram of a voltage controlling circuit 200 according to an embodiment of the present invention. As shown in FIG. 5, besides the gain amplifying module 110 and the gain controlling module 120 shown in FIG. 1, the voltage controlling circuit 200 further includes a voltage clamping module 220, which includes a capacitor C2, an upper bound voltage clamping module 230, and a lower bound voltage clamping module 240. The capacitor C2 has the same usage as the capacitor C1 shown in FIG. 2, so the usage of the capacitor C2 is not described again here. The purpose of the voltage clamping module 220 is to clamp the voltage level at a node Vx, which is located at one terminal of the capacitor C2 and corresponds to the node LV1 shown in FIG. 2, within a predetermined range so that the gain controlling module 120 which receives the voltage level at the node Vx will generate the output signal Vout without peaks introduced by the over-charged or over-discharged voltage level at the node Vx; where the upper bound voltage clamping module 230 is utilized for limiting the voltage level at the node Vx to be below an upper bound voltage level provided by an upper bound voltage source V2, the lower bound voltage clamping module 240 is utilized for limiting the voltage level at the node Vx to be above a lower bound voltage level provided by a lower bound voltage source V1, and the voltage clamping module 220 is directly supplied power by a DC voltage source VDD.

Figure 6:
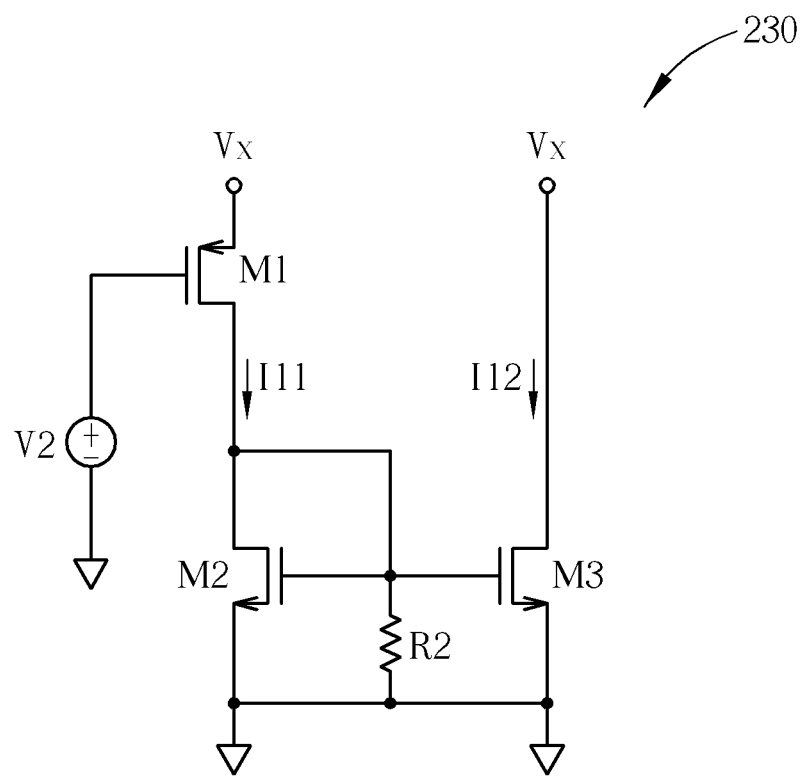
FIG. 6, FIG. 7, FIG. 12, and FIG. 15 illustrate the upper bound voltage clamping module shown in FIG. 5 according to embodiments of the present invention.

Please refer to FIG. 6, which illustrates the upper bound voltage clamping module 230 shown in FIG. 5 in detail. The upper bound voltage clamping module 230 includes N-type MOSFETs M2 and M3, a P-type MOSFET M1, and a resistor R2. The P-type MOSFET M1 has a gate coupled to the upper bound voltage source V2, and has a source coupled to the node Vx. The N-type MOSFET M2 has a drain coupled to a drain of the P-type MOSFET M1 and a gate of the N-type MOSFET M2, and has a source coupled to ground. The N-type MOSFET M3 has a gate coupled to the gate of the N-type MOSFET M2, has a source coupled to ground, and has a drain coupled to the node Vx. The resistor R2 has a first terminal coupled to the gate of the N-type MOSFET M2, and has a second terminal coupled to ground. In the embodiment shown in FIG. 6, the upper bound voltage level is equal to the voltage level of the DC voltage source VDD minus a bias voltage between the source and the gate of a P-type MOSFET.

When the voltage level at the node Vx is charged to be higher than the upper bound voltage level, the P-type MOSFET M1 is turned on and generates a current I11; through a current mirror formed by both the N-type MOSFETs M2 and M3, a current I12 is correspondingly generated on the N-type MOSFET M3. The current I12 is configured to discharge the capacitor C2 so that the voltage level at the node Vx is lower than the upper bound voltage level, the P-type MOSFET M1 is switched off, and the node Vx stops being discharged. Therefore, the upper bound voltage clamping module 230 is capable of limiting the voltage level at the node Vx below the upper bound voltage level in a dynamic manner.

Figure 7:
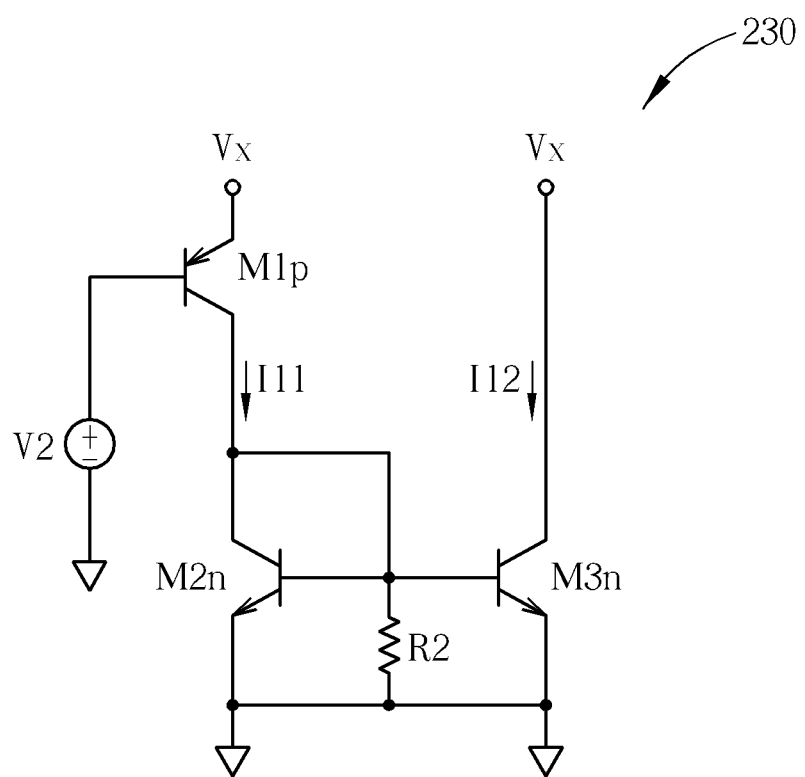

Please refer to FIG. 7, which illustrates the upper bound voltage clamping module 230 according to another embodiment of the present invention. The upper bound voltage clamping module 230 shown in FIG. 6 and FIG. 7 shares the same operations and couplings between elements, except for the fact that the P-type MOSFETs in FIG. 6 are replaced by pnp BJTs in FIG. 7 and that the N-type MOSFET in FIG. 6 is replaced by an npn BJT in FIG. 7. The upper bound voltage level utilized in FIG. 7 may be equal to the voltage level of the DC voltage source VDD minus a bias voltage between the emitter and the base of a pnp BJT.

Figure 8:
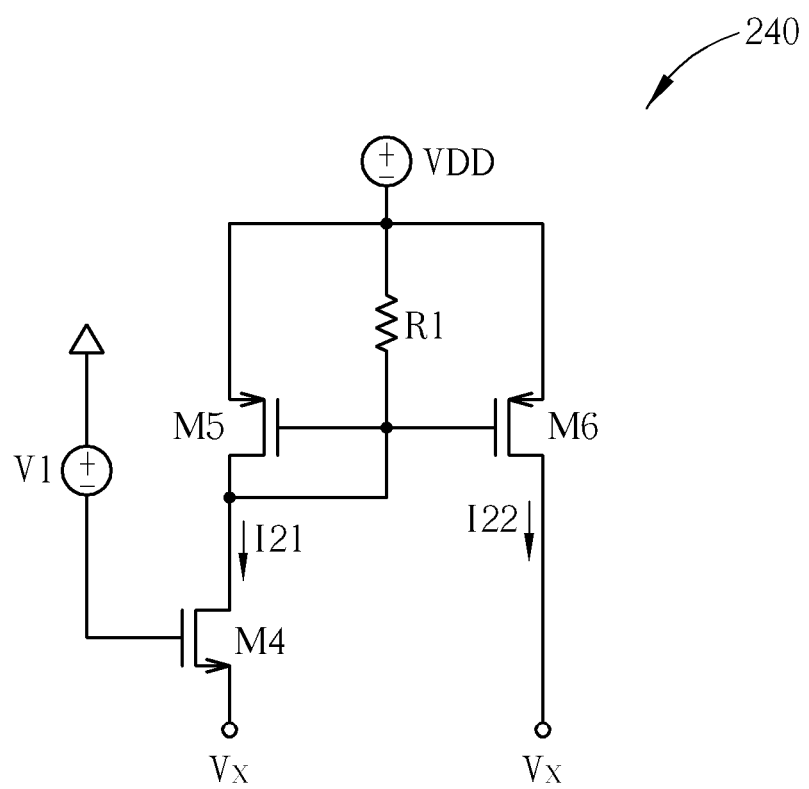
FIG. 8, FIG. 9, FIG. 10, FIG. 11, FIG. 13, and FIG. 14 illustrate the lower bound voltage clamping module shown in FIG. 5 according to embodiments of the present invention.

Please refer to FIG. 8, which illustrates the lower bound voltage clamping module 240 shown in FIG. 5 according to one embodiment of the present invention. The lower bound voltage clamping module 24 includes an N-type MOSFET M4, P-type MOSFETs M5 and M6, and a resistor R1. The N-type MOSFET M4 has a gate coupled to a lower bound voltage source V1, and has a source coupled to the node Vx. The P-type MOSFET M5 has a drain coupled to a drain of the N-type MOSFET M4 and a gate of the P-type MOSFET M5, and has a source coupled to the DC voltage source VDD. The P-type MOSFET M6 has a drain coupled to the node Vx, and has a gate coupled to the gate of the P-type MOSFET M5. The P-type MOSFET M6 has a source coupled to the source of the P-type MOSFET M5. The resistor R1 has a first terminal coupled to the gate of the P-type MOSFET M5, and has a second terminal coupled to the source of the P-type MOSFET M5. In the embodiment shown in FIG. 8, the lower bound voltage level is equal to the voltage level of the ground plus a bias voltage between the gate and the source of an N-type MOSFET.

When the voltage level at the node Vx is discharged to be lower than the lower bound voltage level, the N-type MOSFET M4 is switched on and introduces a current I21. With the aid of the current mirror formed by the P-type MOSFETs M5 and M6, a current I22 is correspondingly generated on the P-type MOSFET M6. The current I22 is configured to charge the capacitor C2 so that the voltage level at the node Vx is higher than the lower bound voltage level, the N-type MOSFET M4 is switched off, and the charging at the node Vx is stopped. Therefore, the lower bound voltage clamping module 240 is capable of limiting the voltage level at the node Vx to be higher than the lower bound voltage level in a dynamic manner.

Figure 9:
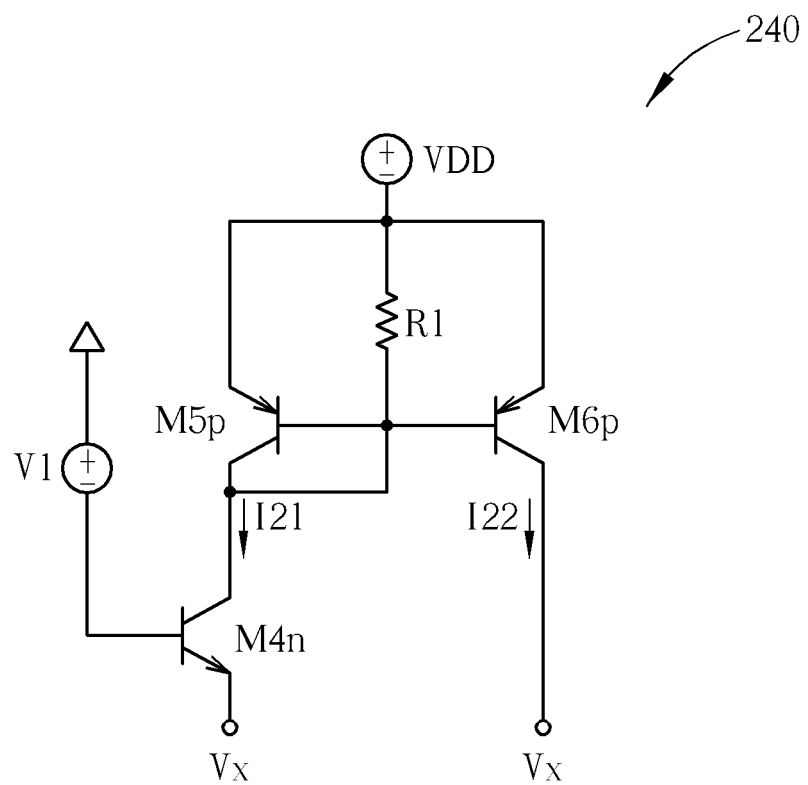

Please refer to FIG. 9, which illustrates the lower bound voltage clamping module 240 according to another embodiment of the present invention. The lower bound voltage clamping module 240 shares the same operations and couplings between elements, except for the fact that the N-type MOSFET M4 in FIG. 8 is replaced by an npn BJT M4n in FIG. 9 and that the P-type MOSFETs M5 and M6 are replaced by pnp BJTs M5p and M6p respectively. In the embodiment shown in FIG. 9, the lower bound voltage level may be equal to the voltage level of the ground plus a bias voltage between the emitter and the base of an npn BJT.

Figure 10:
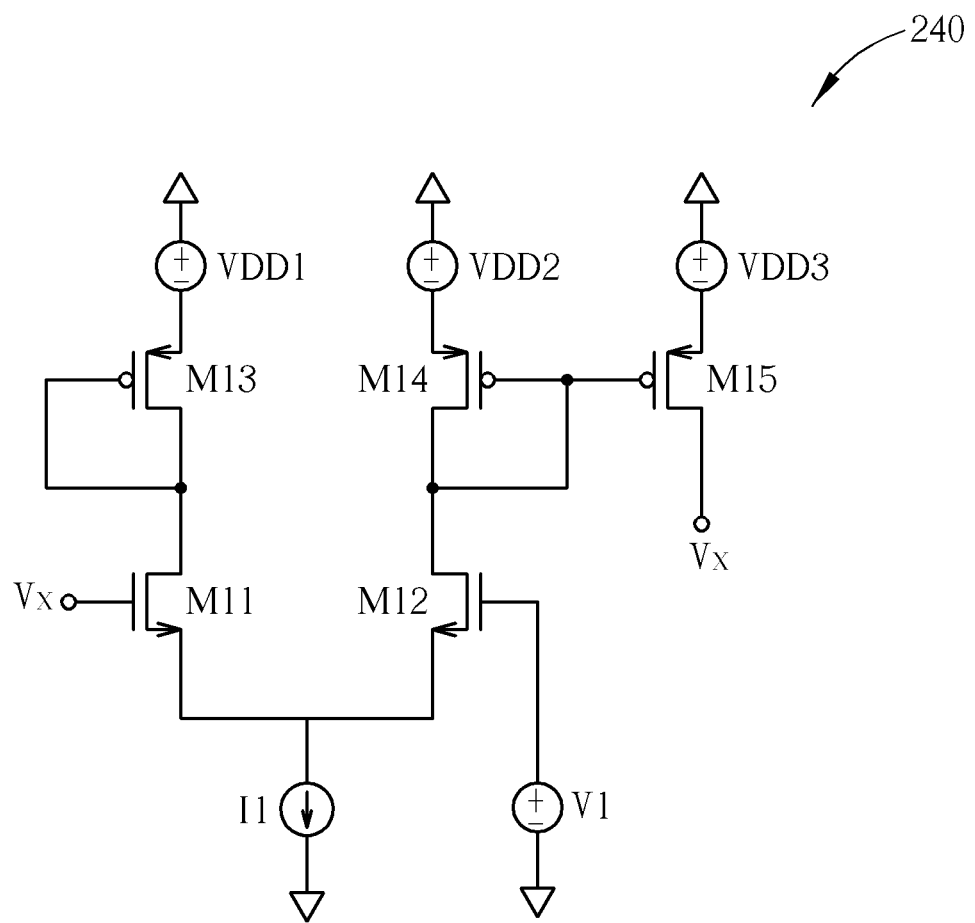

Please refer to FIG. 10, which illustrates the lower bound voltage clamping module 240 according to one embodiment of the present invention. The lower bound voltage clamping module 240 includes N-type MOSFETs M11 and M12 and P-type MOSFETs M13, M14 and M15. The N-type MOSFET M11 has a gate coupled to the node Vx, and has a source coupled to the ground via a current source I1. The N-type MOSFET M12 has a source coupled to the source of the N-type MOSFET M11, and has a gate coupled to the lower bound voltage source V1. The P-type MOSFET M13 has a drain coupled to a drain of the N-type MOSFET M11 and a gate of the P-type MOSFET M13, and has a source coupled to a voltage source VDD1. The P-type MOSFET M14 has a drain coupled to a drain of the N-type MOSFET M12 and a gate of the P-type MOSFET M14, and has a source coupled to a voltage source VDD2. The P-type MOSFET M15 has a drain coupled to the node Vx, has a gate coupled to the gate of the P-type MOSFET M14, and has a source coupled to a voltage source VDD3. The voltage sources VDD1, VDD2, and VDD3 are all generated from the DC voltage source VDD and share a same voltage level as the DC voltage source VDD. In FIG. 10, the lower bound voltage level provided by the lower bound voltage source V1 may be equal to the voltage level of the ground plus a bias voltage between the source and the gate of a P-type MOSFET.

When the node Vx is discharged to be lower than the lower bound voltage level, the N-type MOSFET M11 is switched off; at this time, because of a constant current source I1 introduced by both the N-type MOSFETs M11 and M12, the current flowing through the N-type MOSFET M12 is raised so that the voltage level at the gate of the P-type MOSFET M15 is reduced, the P-type MOSFET M15 is thus switched on, and the voltage level at the node Vx is raised as a result. When the voltage level at the node Vx is raised to be higher than the lower bound voltage level, the N-type MOSFET M11 is switched on again, and the voltage level at the gate of the P-type MOSFET M15 is raised again with the aid of a current mirror formed by the N-type MOSFETs M11 and M12, so that the P-type MOSFET M15 is switched off and the node Vx stops being charged. Therefore, the lower bound voltage clamping module 240 shown in FIG. 10 is capable of limiting the voltage level at the node Vx to be higher than the lower bound voltage level in a dynamic manner.

Figure 11:
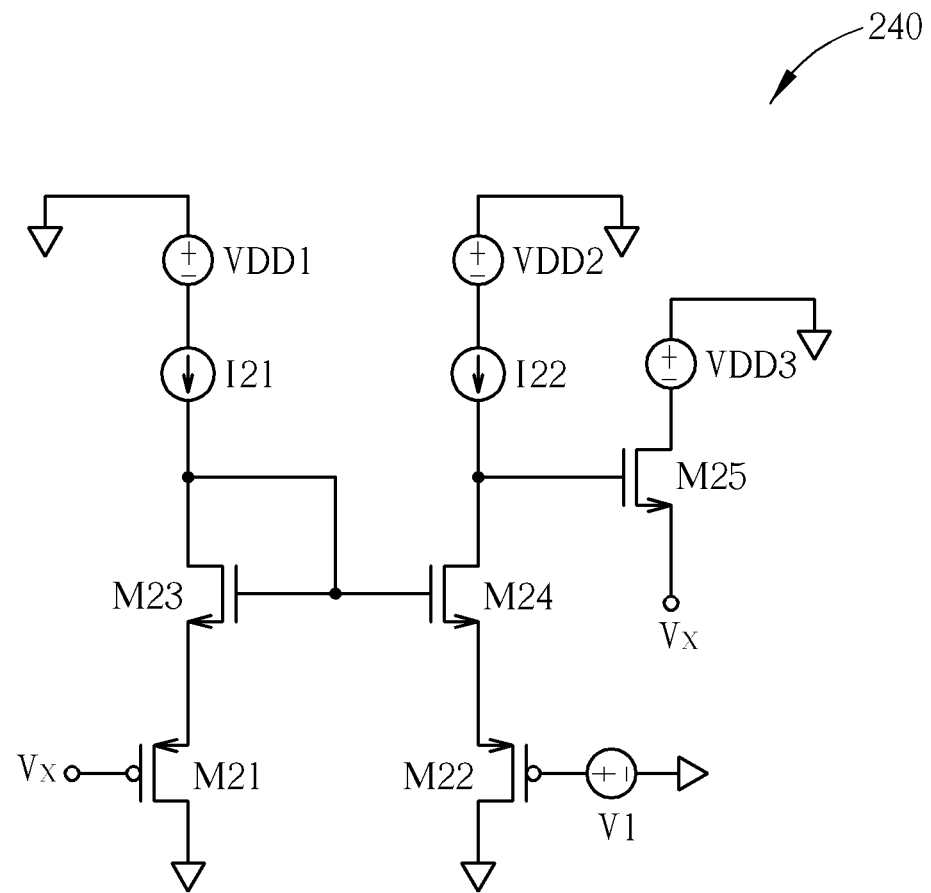

Please refer to FIG. 11, which illustrates the lower bound voltage clamping module 240 according to one embodiment of the present invention. The lower bound voltage clamping module 240 includes P-type MOSFETs M21 and M22, and N-type MOSFETs M23, M24 and M25. The P-type MOSFET M21 has a drain coupled to ground, and has a gate coupled to the node Vx. The P-type MOSFETs M22 has a drain coupled to ground, and has a gate coupled to the lower bound voltage source V1. The N-type MOSFET M23 has a source coupled to a source of the P-type MOSFET M21, and has a drain coupled to the voltage source VDD1 and a gate of the N-type MOSFET M23. The N-type MOSFET M24 has a source coupled to a source of the P-type MOSFET M22, a gate coupled to the gate of the N-type MOSFET M23, and a drain coupled to the voltage source VDD2. The N-type MOSFET M25 has a drain coupled to the voltage source VDD3, a gate coupled to the drain of the N-type MOSFET M24, and a source coupled to the node Vx. The voltage sources VDD1, VDD2 and VDD3 share a same voltage level. The lower bound voltage level in FIG. 11 may be equal to the voltage level of the ground plus a bias voltage between the source and the gate of a P-type MOSFET.

When the voltage level at the node Vx is discharged to be lower than the lower bound voltage level, the P-type MOSFET M21 is switched on, and the voltage level at the gate of the N-type MOSFET M24 is reduced because of a constant current source I21, so that the N-type MOSFET M24 is switched off; at this time, the voltage level at the gate of the N-type MOSFET M25 is raised by being charged by the current source I22, so that the N-type MOSFET M25 is switched on and the voltage level at the node Vx is raised by being directly charged by the voltage source VDD3. Then, when the voltage level at the node Vx is raised to be higher than the lower bound voltage level, the P-type MOSFET M21 is switched off, the N-type MOSFET M24 is switched on, and the N-type MOSFET M25 is switched off so that the node Vx stops being charged. Therefore, the lower bound voltage clamping module 240 shown in FIG. 11 is capable of limiting the voltage level at the node Vx to be higher than the lower bound voltage level in a dynamic manner.

Figure 12:
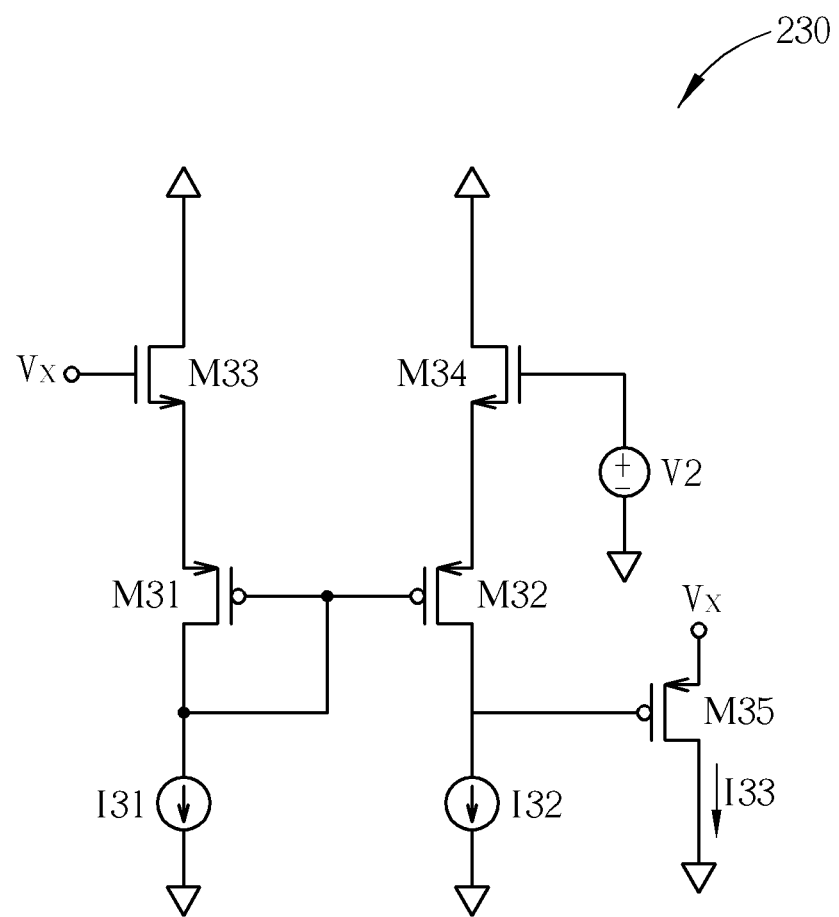

Please refer to FIG. 12, which illustrates the upper bound voltage clamping module 230 according to one embodiment of the present invention. The upper bound voltage clamping module 230 includes P-type MOSFETs M31, M32 and M33, and N-type MOSFETs M33 and M34. The P-type MOSFET M31 has a drain coupled to a gate of the P-type MOSFET M31 and ground. The P-type MOSFET M32 has a drain coupled to ground, and has a gate coupled to the gate of the P-type MOSFET M31. The N-type MOSFET M33 has a source coupled to a source of the P-type MOSFET M31, a gate coupled to the node Vx, and a drain coupled to ground. The N-type MOSFET M34 has a source coupled to a source of the P-type MOSFET M32, a drain coupled to ground, and a gate coupled to the upper bound voltage source V2. The P-type MOSFET M35 has a gate coupled to the drain of the P-type MOSFET M32, a source coupled to the node Vx, and a drain coupled to ground. In the upper bound voltage clamping circuit 230 shown in FIG. 12, the upper bound voltage level provided by the upper bound voltage source V2 may be equal to the voltage level of the DC voltage source VDD minus a bias voltage between the source and the gate of an N-type MOSFET.

When the voltage level at the node Vx is charged by the capacitor C2 and is higher than the upper bound voltage level, the N-type MOSFET M33 is switched on; at this time, because of the current sources I31 and I32 introduced by the P-type MOSFETs M31 and M32, the P-type MOSFET M35 is switched on via the voltage level at the gate of the P-type MOSFET M35 discharged by the current source I32, so that the voltage level at the node Vx is discharged by a current I33. When the voltage level at the node Vx is discharged to be lower than the upper bound voltage level, the N-type MOSFET M33 is switched off so that the voltage level at the gate of the P-type MOSFET M35 is raised without being discharged by the current source I32, and the P-type MOSFET M35 is switched off to stop discharging the node Vx. Therefore, the upper bound voltage clamping module 230 is capable of limiting the voltage level at the node Vx to be lower than the upper bound voltage level in a dynamic manner.

Figure 13:
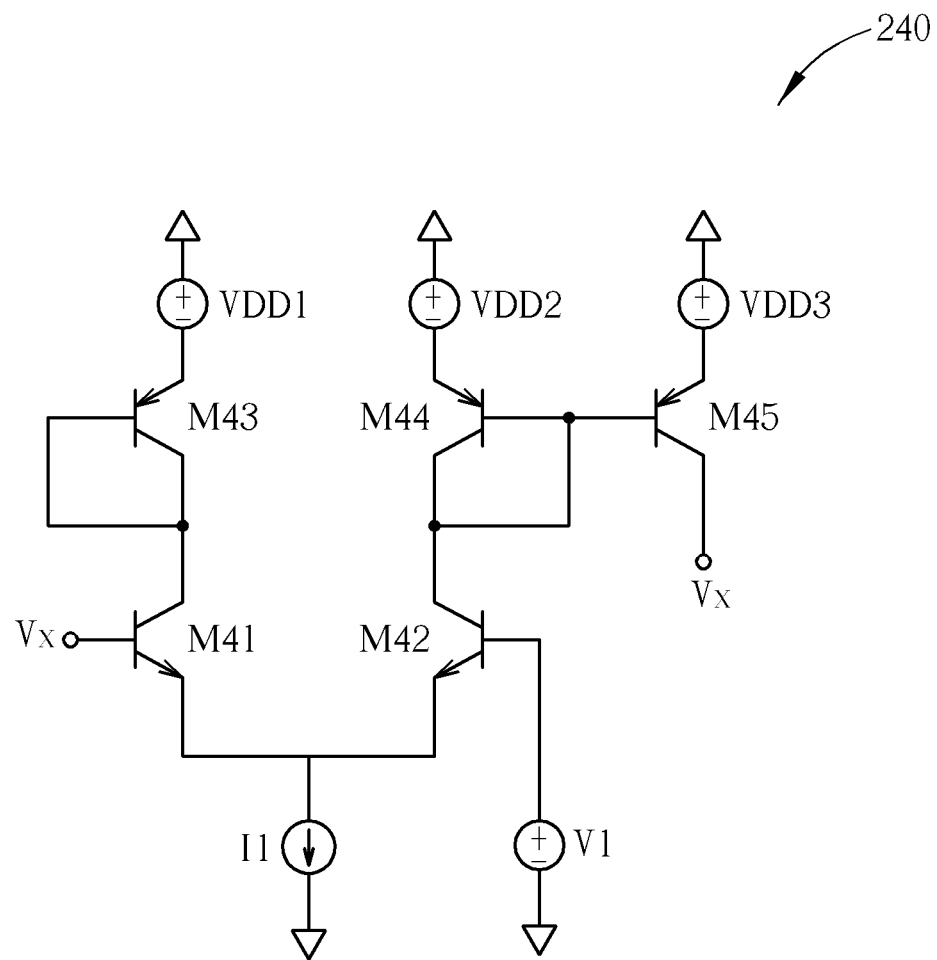

Please refer to FIG. 13, which illustrates the lower bound voltage clamping module 240 according to another embodiment of the present invention. As can be observed from FIG. 10 and FIG. 13, the N-type MOSFETs M11 and M12 shown in FIG. 10 are respectively replaced by npn BJTs M41 and M42 in FIG. 13, and the P-type MOSFETs M13, M14, and M15 in FIG. 10 are respectively replaced by pnp BJTs M43, M44, and M45 in FIG. 13. The lower bound voltage clamping module 240 shares the same operations and couplings between elements in FIG. 10 and FIG. 13.

Figure 14:
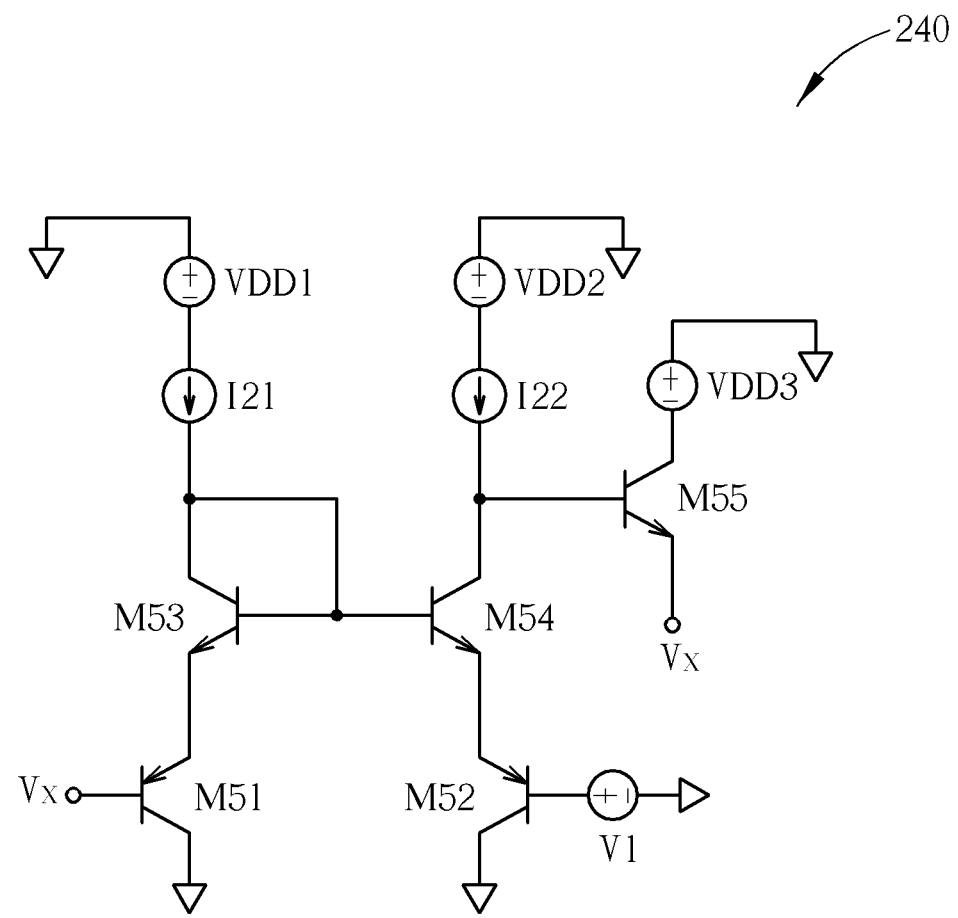

Please refer to FIG. 14, which illustrates the lower bound voltage clamping module 240 according to another embodiment of the present invention. As can be observed from FIG. 11 and FIG. 14, the P-type MOSFETs M21 and M22 in FIG. 11 are respectively replaced by pnp BJTs M51 and M52 in FIG. 14, and N-type MOSFETs M23, M24, and M25 in FIG. 11 are respectively replaced by npn BJTs M53, M54, and M55 in FIG. 14. The lower bound voltage clamping module 240 shares the same operations and couplings between elements in FIG. 11 and FIG. 14.

Figure 15:
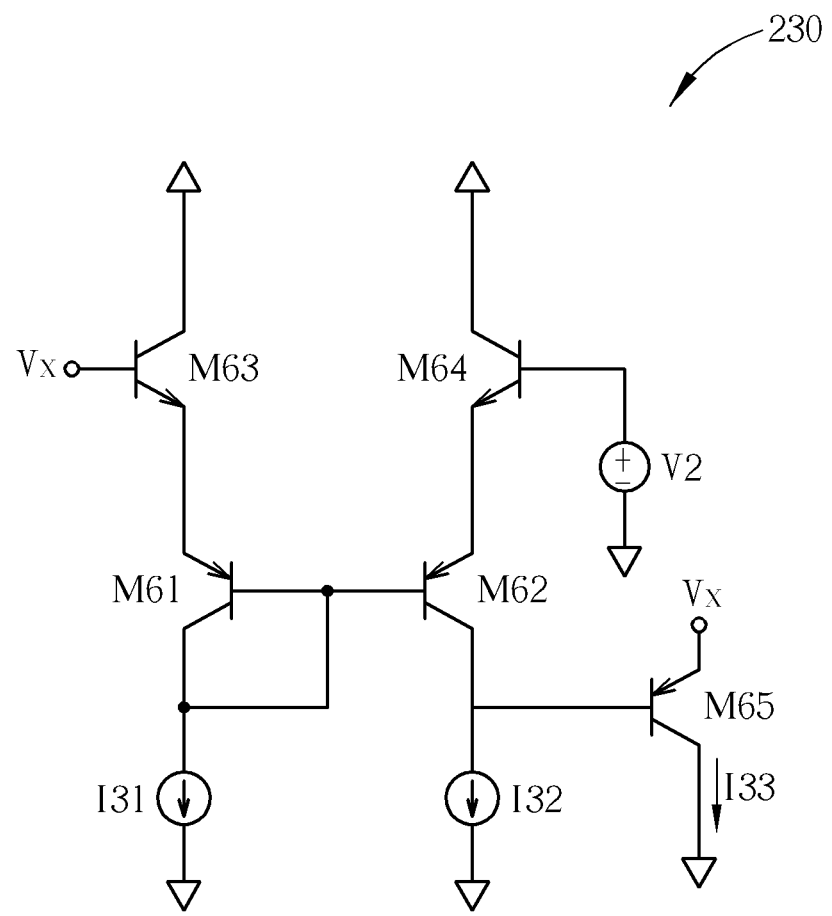

Please refer to FIG. 15, which illustrates the upper bound voltage clamping module 230 according to another embodiment of the present invention. As can be observed from FIG. 12 and FIG. 15, the N-type MOSFETs M33 and M34 in FIG. 12 are respectively replaced by npn BJTs M63 and M64 in FIG. 15, and the P-type MOSFETs M31, M32, and M35 in FIG. 12 are respectively replaced by pnp BJTs M61, M62, and M65 in FIG. 15. The lower bound voltage clamping modules 230 shown in FIG. 12 and FIG. 15 share the same operations and couplings between elements.

The present invention discloses voltage controlling circuit for clamping a voltage level of an amplifying signal within a predetermined range which may be between an upper bound voltage level and a lower bound voltage level. Therefore, peaks of an output signal occurred because of an over-charged or over-discharged amplifying signal can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage controlling circuit, comprising:
   a gain amplifying module for generating an amplifying signal according to an input signal;
   a voltage clamping module coupled to the gain amplifying module for clamping a voltage level of the amplifying signal within a predetermined range so as to generate a voltage clamping signal; and
   a gain controlling module coupled to the voltage clamping module for generating an output signal according to a selection signal and the voltage clamping signal;
   wherein the voltage clamping module comprises:
      a capacitor having a first terminal coupled to the gain amplifying module for receiving the amplifying signal; and
      an upper bound voltage clamping module having a terminal coupled to a second terminal of the capacitor for limiting the voltage level of the amplifying signal within an upper bound voltage level, wherein the upper bound voltage clamping module comprises a P-type metal-oxide semiconductor field effect transistor (MOSFET) having a gate coupled to a voltage source and having a source coupled to the second terminal of the capacitor, wherein the voltage source is configured to provide the upper bound voltage level.

2. The voltage controlling circuit of claim 1 wherein the upper bound voltage clamping module further comprises:
   a first N-type MOSFET having a drain coupled between a drain of the P-type MOSFET and a gate of the first N-type MOSFET, and having a source coupled to ground;
   a second N-type MOSFET having a gate coupled to the gate of the first N-type MOSFET, having a source coupled to ground, and having a drain coupled to the source of the P-type MOSFET; and
   a resistor having a first terminal coupled to the gate of the first N-type MOSFET, and having a second terminal coupled to ground.

3. The voltage controlling circuit of claim 1 wherein the upper bound voltage clamping module comprises:
   a pnp bipolar junction transistor (BJT) having a gate coupled to a voltage source, and having an emitter coupled to the second terminal of the capacitor, wherein the voltage source is configured to provide the upper bound voltage level;
   a first npn BJT having a collector coupled between a collector of the pnp BJT and a base of the first npn BJT, and having an emitter coupled to ground;
   a second npn BJT having a base coupled to the base of the first npn BJT, having an emitter coupled to ground, and having a collector coupled to the emitter of the pnp BJT; and
   a resistor having a first terminal coupled to the base of the first npn BJT, and a second terminal coupled to ground.

4. The voltage controlling circuit of claim 1 wherein the upper bound voltage clamping module comprises:
   a first P-type MOSFET having a drain coupled between ground and a gate of the first P-type MOSFET;
   a second P-type MOSFET having a drain coupled to ground, and having a gate coupled to the gate of the first P-type MOSFET;
   a first N-type MOSFET having a source coupled to the source of the first P-type MOSFET, having a gate coupled to the second terminal of the capacitor, and having a drain coupled to ground;
   a second N-type MOSFET having a source coupled to the source of the second P-type MOSFET, having a drain coupled to ground, and having a gate coupled to a voltage source which is configured to provide the upper bound voltage level; and
   a third P-type MOSFET having a gate coupled to the drain of the second P-type MOSFET, having a source coupled to the second terminal of the capacitor, and having a drain coupled to ground.

5. The voltage controlling circuit of claim 1, wherein the upper bound voltage clamping module comprises:
   a first pnp BJT having a collector coupled between ground and a base of the first pnp BJT;
   a second pnp BJT having a collector coupled to ground, and having a base coupled to the base of the first pnp BJT;
   a first npn BJT having an emitter coupled to the emitter of the first pnp BJT, having a base coupled to the second terminal of the capacitor, and having a collector coupled to ground;
   a second npn BJT having an emitter coupled to the emitter of the second pnp BJT, having a collector coupled to ground, and having a base coupled to a voltage source which is configured to provide the upper bound voltage level;
   and
   a third pnp BJT having a base coupled to the drain of the second pnp BJT, having an emitter coupled to the second terminal of the capacitor, and having a collector coupled to ground.

6. The voltage controlling circuit of claim 1 wherein the voltage clamping module comprises:
   a capacitor having a first terminal coupled to the gain amplifying module for receiving the amplifying signal; and
   a lower bound voltage clamping module having a terminal coupled to the second terminal of the capacitor, the lower bound voltage clamping module being utilized for limiting the voltage level of the amplifying signal within a lower bound voltage level.

7. The voltage controlling circuit of claim 6 wherein the lower bound voltage clamping module comprises:
   an N-type MOSFET having a gate coupled to a first voltage source, and having a source coupled to the second terminal of the capacitor, wherein the first voltage source is configured to provide the lower bound voltage level;
   a first P-type MOSFET having a drain coupled between a drain of the N-type MOSFET and a gate of the first P-type MOSFET, and having a source coupled to a second voltage source;
   a second P-type MOSFET having a drain coupled to the source of the N-type MOSFET, having a gate coupled to the gate of the first P-type MOSFET,) and having a source coupled to the source of the first P-type MOSFET; and a resistor having a first terminal coupled to the gate of the first P-type MOSFET, and having a second terminal coupled to the source of the first P-type MOSFET.

8. The voltage controlling circuit of claim 6, wherein the lower bound voltage clamping module comprises:
an npn BJT having a base coupled to a first voltage source, and having an emitter coupled to the second terminal of the capacitor, wherein the first voltage source is configured to provide the lower bound voltage level;)
a first pnp BJT having a collector coupled between a collector of the npn BJT and a base of the first pnp BJT, and having an emitter coupled to a second voltage source;
a second pnp BJT having a collector coupled to the emitter of the npn BJT, having a base coupled to the base of the first pnp BJT, and having an emitter coupled to the emitter of the first pnp BJT; and
a resistor having a first terminal coupled to the base of the first pnp BJT, and having a second terminal coupled to the emitter of the first pnp BJT.

9. The voltage controlling circuit of claim 6 wherein the lower bound voltage clamping module comprises:
a first N-type MOSFET having a gate coupled to the second terminal of the capacitor, and having a source coupled to ground;
a second N-type MOSFET having a source coupled to the source of the first N-type MOSFET, and having a gate coupled to a first voltage source, wherein the first voltage source is configured to provide the lower bound voltage level;
a first P-type MOSFET having a drain coupled between a drain of the first N-type MOSFET and a gate of the first P-type MOSFET, and having a source coupled to a second voltage source;
a second P-type MOSFET having a drain coupled between a drain of the second N-type MOSFET and a gate of the second P-type MOSFET, and having a source coupled to a third voltage source; and
a third P-type MOSFET having a drain coupled to the second terminal of the capacitor, having a gate coupled to the gate of the second P-type MOSFET, and having a source coupled to a fourth voltage source;
wherein voltage levels of the second voltage source, the third voltage source, and the fourth voltage source are equal.

10. The voltage controlling circuit of claim 6 wherein the lower bound voltage clamping module comprises:
a first npn BJT having a base coupled to the second terminal of the capacitor, and having an emitter coupled to ground;
a second npn BJT having an emitter coupled to the emitter of the first npn BJT, and having a base coupled to a first voltage source which is configured to provide the lower bound voltage level;
a first pnp BJT having a collector coupled between a collector of the first npn BJT and a base of the first pnp BJT, and having an emitter coupled to a second voltage source;
a second pnp BJT having a collector coupled between a collector of the second npn BJT and a base of the second pnp BJT, and having an emitter coupled to a third voltage source; and
a third pnp BJT having a collector coupled to the second terminal of the capacitor, having a base coupled to the base of the second pnp BJT, and having an emitter coupled to a fourth voltage source;
wherein voltage levels of the second voltage source, the third voltage source, and the fourth voltage source are equal.

11. The voltage controlling circuit of claim 6, wherein the lower bound voltage clamping module comprises:
a first P-type MOSFET having a drain coupled to ground, and having a gate coupled to the second terminal of the capacitor;
a second P-type MOSFET having a drain coupled to ground, and having a gate coupled to a first voltage source which is configured to provide the lower bound voltage level;
a first N-type MOSFET having a source coupled to a source of the first P-type MOSFET, and having a drain coupled between a second voltage source and a gate of the first N-type MOSFET;
a second N-type MOSFET having a source coupled to a source of the second P-type MOSFET, having a gate coupled to the gate of the first N-type MOSFET, and having a drain coupled to a third voltage source; and
a third N-type MOSFET having a drain coupled to a fourth voltage source, having a gate coupled to the drain of the second N-type MOSFET, and having a source coupled to the second terminal of the capacitor;
wherein voltage levels of the second voltage source and the third voltage source are equal.

12. The voltage controlling circuit of claim 6 wherein the lower bound voltage clamping module comprises:
a first pnp BJT having a collector coupled to ground, and having a base coupled to the second terminal of the capacitor;
a second pnp BJT having a collector coupled to ground, and having a base coupled to a first voltage source, wherein the first voltage source is configured to provide the lower bound voltage level;
a first npn BJT having an emitter coupled to an emitter of the first pnp BJT, having a collector coupled between a second voltage source and a base of the first npn BJT;
a second npn BJT having an emitter coupled to an emitter of the second pnp BJT, having a base coupled to the base of the first npn BJT, and having a collector coupled to a third voltage source; and
a third npn BJT having a collector coupled to a fourth voltage source, having a gate coupled to the collector of the second npn BJT, and having an emitter coupled to the second terminal of the capacitor;
wherein voltage levels of the second voltage source and the third voltage source are equal.

* * * * *